United States Patent
Onai et al.

(10) Patent No.: US 9,572,294 B2
(45) Date of Patent: Feb. 14, 2017

(54) CIRCUIT DEVICE AND METHOD FOR MANUFACTURING SAME

(75) Inventors: Nobuhisa Onai, Ota (JP); Masami Motegi, Gunma (JP)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 294 days.

(21) Appl. No.: 13/882,952

(22) PCT Filed: Oct. 12, 2011

(86) PCT No.: PCT/JP2011/005716
§ 371 (c)(1),
(2), (4) Date: Jul. 9, 2013

(87) PCT Pub. No.: WO2012/060054
PCT Pub. Date: May 10, 2012

(65) Prior Publication Data
US 2013/0286594 A1    Oct. 31, 2013

(30) Foreign Application Priority Data
Nov. 4, 2010 (JP) .................. 2010-247063

(51) Int. Cl.
H05K 13/04   (2006.01)
H05K 1/02    (2006.01)
(Continued)

(52) U.S. Cl.
CPC ......... H05K 13/0465 (2013.01); H01L 21/563 (2013.01); H01L 23/142 (2013.01);
(Continued)

(58) Field of Classification Search
CPC .. H05K 3/341; H05K 13/0465; H05K 1/0298; H05K 3/3484; H01L 24/83; H01L 23/4334; H01L 23/36; H01L 25/50; H01L 25/065
(Continued)

(56) References Cited

U.S. PATENT DOCUMENTS 4,748,085 A * 5/1988 Fukuda .................. C04B 35/111
257/E23.009
4,775,917 A * 10/1988 Eichhorn ............. H05K 3/3426
257/682
(Continued)

FOREIGN PATENT DOCUMENTS

JP    2002-134682    5/2002
JP    2006-237573    9/2006
(Continued)

OTHER PUBLICATIONS

International Search Report mailed Jan. 10, 2012, directed to International Application No. PCT/JP2011/005716; 5 pages.

*Primary Examiner* — Stephen Sul
(74) *Attorney, Agent, or Firm* — Rennie William Dover

(57) ABSTRACT

Provided are: a circuit device which has improved connection reliability in a solder joint portion by suppressing the occurrence of sink of solder; and a method for manufacturing the circuit device. In a method for manufacturing a circuit device of the present invention, a plurality of solders (19), which are apart from each other, are firstly formed on the upper surface of a pad (18A), and a chip component (14B) and a transistor (14C) are affixed at the same time. After that, a solder paste (31) is supplied to the upper surface of the pad (18A) using a syringe (30), a heatsink (14D) is mounted on top of the solder paste (31), and melting is caused by a reflow process. There is little risk of sinking of
(Continued)

the solders (19) in the present invention since the solders (19) are discretely arranged on the upper surface of the pad (18A).

14 Claims, 10 Drawing Sheets

(51) Int. Cl.

| | | |
|---|---|---|
| *H01L 21/56* | (2006.01) | |
| *H01L 23/14* | (2006.01) | |
| *H01L 23/31* | (2006.01) | |
| *H01L 23/36* | (2006.01) | |
| *H01L 23/433* | (2006.01) | |
| *H01L 23/00* | (2006.01) | |
| *H01L 25/00* | (2006.01) | |
| *H05K 3/34* | (2006.01) | |
| *H01L 25/18* | (2006.01) | |

(52) U.S. Cl.
CPC .......... *H01L 23/3121* (2013.01); *H01L 23/36* (2013.01); *H01L 23/4334* (2013.01); *H01L 24/27* (2013.01); *H01L 25/18* (2013.01); *H01L 25/50* (2013.01); *H05K 1/0298* (2013.01); *H05K 3/341* (2013.01); *H05K 3/3484* (2013.01); *H01L 24/48* (2013.01); *H01L 24/73* (2013.01); *H01L 2224/32225* (2013.01); *H01L 2224/451* (2013.01); *H01L 2224/45015* (2013.01); *H01L 2224/45124* (2013.01); *H01L 2224/45144* (2013.01); *H01L 2224/45147* (2013.01); *H01L 2224/48091* (2013.01); *H01L 2224/48227* (2013.01); *H01L 2224/48472* (2013.01); *H01L 2224/73265* (2013.01); *H01L 2924/01004* (2013.01); *H01L 2924/014* (2013.01); *H01L 2924/0105* (2013.01); *H01L 2924/01005* (2013.01); *H01L 2924/01006* (2013.01); *H01L 2924/01013* (2013.01); *H01L 2924/01029* (2013.01); *H01L 2924/01033* (2013.01); *H01L 2924/01047* (2013.01); *H01L 2924/01079* (2013.01); *H01L 2924/01082* (2013.01); *H01L 2924/01322* (2013.01); *H01L 2924/01327* (2013.01); *H01L 2924/12041* (2013.01); *H01L 2924/13091* (2013.01); *H01L 2924/14* (2013.01); *H01L 2924/181* (2013.01); *H01L 2924/19105* (2013.01); *H01L 2924/30107* (2013.01); *H05K 2201/1034* (2013.01); *H05K 2201/10166* (2013.01); *H05K 2201/10969* (2013.01); *H05K 2203/0126* (2013.01); *H05K 2203/043* (2013.01); *H05K 2203/1476* (2013.01); *Y02P 70/613* (2015.11)

(58) Field of Classification Search
USPC ......... 257/779; 438/108; 361/717, 718, 719, 361/720, 743, 807, 808; 228/256, 180.1
See application file for complete search history.

(56) References Cited

U.S. PATENT DOCUMENTS

| | | | | |
|---|---|---|---|---|
| 5,461,261 | A * | 10/1995 | Nishiguchi | H01L 24/11 257/737 |
| 7,293,692 | B2 * | 11/2007 | Akamatsu | B23K 3/0638 228/233.2 |
| 2002/0100955 | A1 * | 8/2002 | Potter | H01L 22/20 257/522 |
| 2003/0178476 | A1 * | 9/2003 | Kanai | B23K 35/0244 228/248.1 |
| 2004/0238925 | A1 * | 12/2004 | Morganelli | H01L 21/563 257/678 |
| 2005/0230842 | A1 | 10/2005 | Swanson et al. | |
| 2006/0065421 | A1 | 3/2006 | Arai et al. | |
| 2006/0108402 | A1 * | 5/2006 | Crisp | B23K 3/0623 228/248.1 |
| 2006/0208352 | A1 * | 9/2006 | Lee | H01L 21/563 257/701 |
| 2007/0205017 | A1 * | 9/2007 | Takakusaki | H05K 3/244 174/260 |
| 2007/0221704 | A1 | 9/2007 | Takakusaki et al. | |
| 2009/0085207 | A1 * | 4/2009 | Matsunami | H01L 23/49816 257/738 |
| 2009/0218124 | A1 * | 9/2009 | Magera | H05K 3/3436 174/263 |
| 2010/0013095 | A1 | 1/2010 | Hada et al. | |

FOREIGN PATENT DOCUMENTS

| | | |
|---|---|---|
| JP | 2007-59485 | 3/2007 |
| WO | 2007023743 A1 | 3/2007 |

* cited by examiner

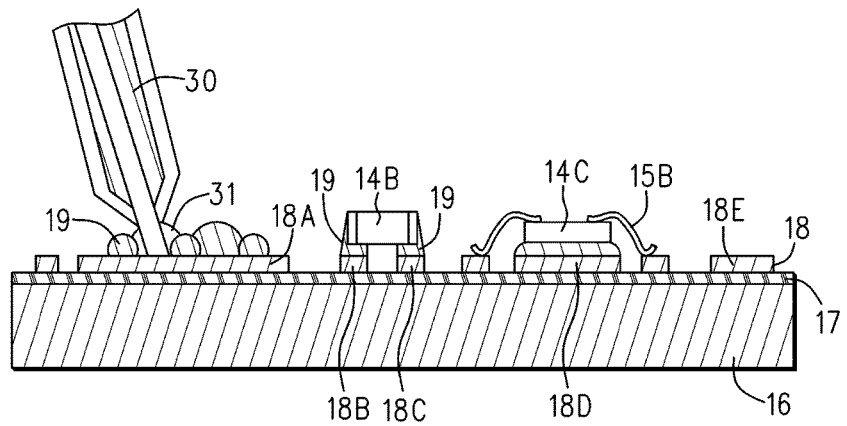
FIG. 6A
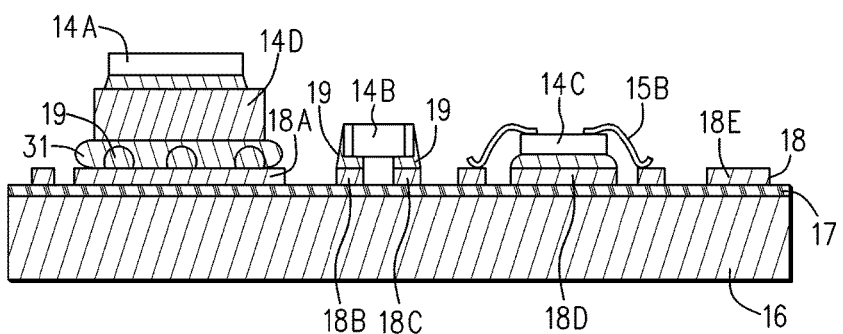
FIG. 6B
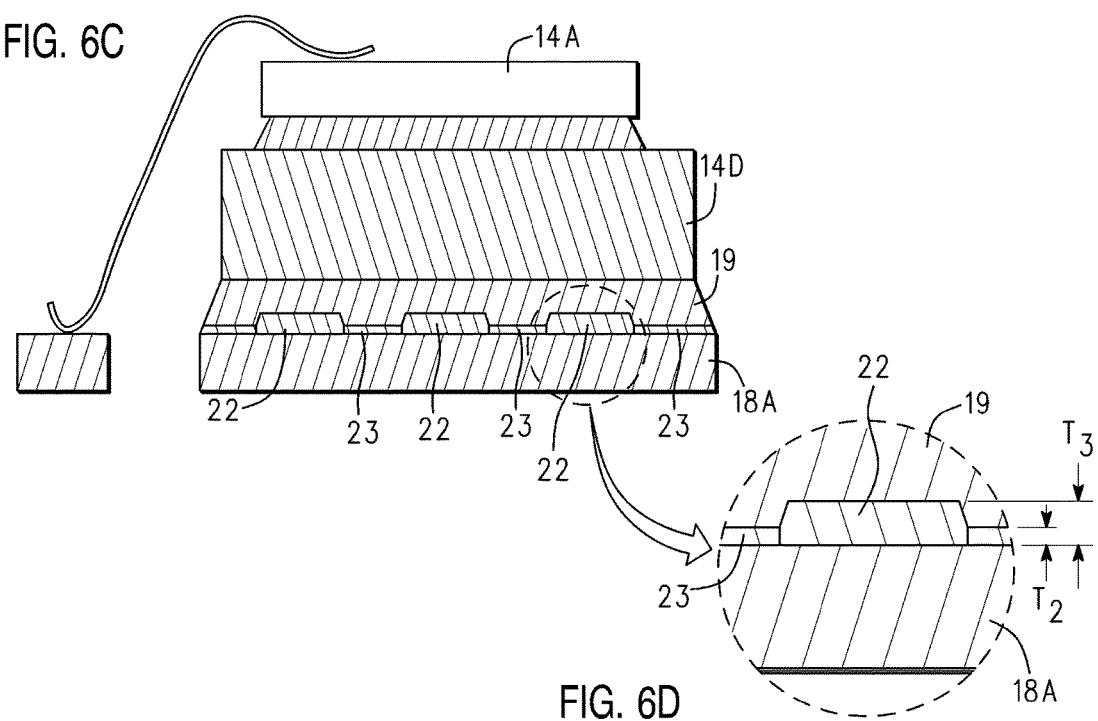
FIG. 6C
FIG. 6D

100

CIRCUIT DEVICE AND METHOD FOR MANUFACTURING SAME

REFERENCE TO RELATED APPLICATIONS

This application is a national stage application under 35 USC 371 of International Application No. PCT/JP2011/005716, filed Oct. 12, 2011, which claims the priority of Japanese Patent Application No. 2010-247063, filed Nov. 4, 2010, the entire contents of which are incorporated herein by reference.

FIELD OF THE INVENTION

The present invention relates to a circuit device and a method for manufacturing the same, and relates particularly to a method for manufacturing a circuit device for soldering a large circuit element.

BACKGROUND OF THE INVENTION

With reference to FIG. 8, a conventional method for manufacturing a circuit device is described. Here, a description is given of a method for manufacturing a hybrid integrated circuit device in which a conductive pattern 108 and circuit elements are formed on a surface of a substrate 106 (refer, for example, to Patent Document 1 below).

Referring to FIG. 8A, first, solder 109 is formed at portions on a surface of the conductive pattern 108 formed on the surface of the substrate 106. The substrate 106 is for example a metallic substrate made of a metal such as aluminum, and is insulated from the conductive pattern 108 by an insulating layer 107. Pads 108A, pads 108B, and pads 108C are formed by the conductive pattern 108. In a later step, a heat sink is attached to an upper portion of each pad 108A. In a later step, a small-signal transistor is attached to each pad 108B. In a later step, a lead is attached to each pad 108C. Here, the solder 109 is formed on the surfaces of the relatively large pads 108A and the pads 108C.

Referring to FIG. 8B, next, a small-signal transistor 104C and a chip component 104B are attached with solder. In this step, heating is performed until the solder for connecting the transistor 104C and the like melts. Consequently, the solder 109 formed on the pads 108A and the pads 108C in the previous step also melt.

Referring to FIG. 8C, next, the small-signal transistor 104C is connected to predetermined portions of the conductive pattern 108 with thin wires 105B.

Referring to FIG. 9A, next, a heat sink 111 and a lead 101 are attached to each pad 108A and each pad 108C, respectively, by melting the solder 109 previously formed thereon. Here, the heat sink 111 has a power transistor 104A placed thereon, and is attached onto the pad 108A via the solder 109 previously formed. Then, the transistor 104A is connected to a desired portion of the conductive pattern 108 with a thick wire 105A.

Referring to FIG. 9B, a sealing resin 102 is formed to cover the circuit elements and the conductive pattern 108 formed on the surface of the substrate 106. With the steps above, a hybrid integrated circuit device 100 is manufactured.

Patent Document 1: Japanese Patent Application Publication No. 2002-134682

SUMMARY OF THE INVENTION

Referring to FIG. 10, the conventional manufacturing method described above, however, has a problem of dewetting of the molten solder 109. FIG. 10A is a plan view of the substrate 106 on which dewetting has occurred, FIG. 10B is a sectional view thereof, and FIG. 10C is an enlarged sectional view of the portion where the dewetting has occurred.

Referring to FIGS. 10A and 10B, the "dewetting" is a phenomenon where the solder 109 applied to the entire surface of the pad 108A is attracted to one side when melted. The pad 108A to which the heat sink 111 is to be attached is formed into a large quadrangle, each side of which is, for example, 9 mm or longer. A large amount of solder is therefore deposited onto the pad 108A compared to other portions, and consequently a large surface tension acts on the molten solder 109, causing dewetting of the solder.

When the solder 109 dewets, a circuit element is not joined to the pad 108A at the dewetting portion. Hence, the thermal resistance around that dewetting portion increases. Further, the dewetting lowers the strength of solder joint, which lowers reliability of the connection at a solder joint against temperature change.

Referring to FIG. 10C, a cause of the dewetting is an alloy layer 110 formed between the pad 108A and the solder 109. When solder paste is deposited onto the upper portion of the pad 108A and is then heated and melted, an intermetallic compound of copper and tin is formed, the copper being a material of the pad 108A, the tin being a material of the solder. In this drawing, a layer made of the intermetallic compound is shown as the alloy layer 110. Specifically, the alloy layer 110 is about several micrometers thick, and is made of an intermetallic compound having a composition of Cu6Sn5 or Cu3Sn. This alloy layer 110 provides extremely poor solder wettability, compared to copper which is the material of the pad 108A. The formation of the alloy layer 110 providing poor solder wettability causes the solder dewetting. Further, when the solder is melted multiple times, the alloy layer 110 formed on the upper surface of the pad 108A becomes thick, which makes the solder wettability even worse. In a description below, an alloy layer made of copper and tin is called a Cu/Sn alloy layer.

In recent years, lead-free solder has been used due to environmental consciousness. When lead-free solder is used as the solder 109A, a thicker alloy layer 110 is formed, and then the above-described dewetting problem occurs noticeably. This is because the lead-free solder contains more tin than tin-lead eutectic solder. Specifically, the percentage of tin contained in general tin-lead eutectic solder is about 60 weight percent, whereas the percentage of tin contained in lead-free solder is about 90 weight percent.

Further, when solder paste in which a rosin-based flux is added is used to aim productivity improvement or other purposes, there arises a problem in which the molten solder paste does not wet. This is because the rosin-based flux is less active than a water-soluble flux. Moreover, the problem of the solder paste not wetting is noticeable in a case where an upper surface of a copper pad is coated with a nickel film and where a rosin-based solder paste is applied to an upper surface of this nickel film.

Poor wettability refers to a situation where solder does not spread because no alloy layer is formed between a pad and the solder. The dewetting, on the other hand, refers to a situation where although an alloy layer is formed between the solder and the pad and the solder wets and spreads temporarily thereon, the solder is soon attracted to one side due to the surface tension of the solder. Hence, when the solder dewetting occurs, the alloy layer is exposed on the upper surface of the pad to cause void formation, as will be described layer.

Further, assume a case where a circuit element is soldered, with a Cu/Sn alloy layer being formed thickly at a border portion between solder and a pad. Then, since a thick Cu/Sn layer has a low mechanical strength, connection reliability of soldering might be degraded.

The present invention has been made in view of the above problems, and a main objective thereof is to provide a method for manufacturing a circuit device in which occurrence of solder dewetting is prevented to improve connection reliability at a solder joint.

A circuit device of the present invention comprises: a substrate; a pad formed on an upper surface of the substrate; and a circuit element attached to the pad with solder. An alloy layer made of an intermetallic compound of a metal forming the solder and a metal forming the pad is formed at a border between the solder and the pad, and the alloy layer has a first alloy layer and a second alloy layer thicker than the first alloy layer.

A method of manufacturing a circuit device of the present invention comprises the steps of: forming a plurality of portions of first solder on an upper surface of a pad placed on a circuit substrate, the portions being spaced away from each other; applying solder paste to cover the portions of first solder and the upper surface of the pad; and placing a circuit element on an upper surface of the solder paste and attaching the circuit element to the pad by heating.

In the circuit device of the present invention, the alloy layer provided at a border between the pad and each portion of solder for soldering the circuit element includes the thick first alloy layer and the thin second alloy layer. Thus, the connection strength is secured by the thin alloy layer, which improves the reliability of connection between the solder and the pad.

In the method for manufacturing a circuit device of the present invention, multiple portions of first solder are placed away from each other on the upper surface of the relatively large pad and bonded. On the upper surface of the pad, multiple pads of first solder are provided discretely, instead of a single solder pad. Thereby, a surface tension acting on each portion of first solder is reduced to prevent the dewetting from occurring in the step of forming the first solder.

Further, since the dewetting of the first solder does not occur, the Cu/Sn alloy layer is not exposed on the upper surface of the pad at a region where no first solder is formed. Since the Cu/Sn alloy layer having poor solder wettability is not exposed, the dewetting is prevented in the next step in which additional solder paste is melted.

BRIEF DESCRIPTION OF THE DRAWINGS

FIG. 6 is diagrams showing the method for manufacturing the circuit device of the preferred embodiment of the invention, FIG. 6A being a sectional view, FIG. 6B being a sectional view, FIG. 6C being an enlarged sectional view, and FIG. 6D being an expanded view of a portion of FIG. 6C.

DETAILED DESCRIPTION OF THE INVENTION

First Embodiment

Figure 1A:
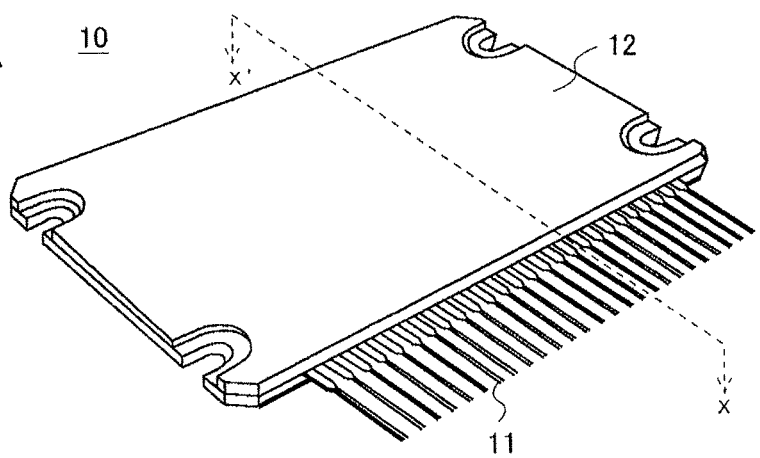
FIG. 1 is diagrams showing a circuit device manufactured by a preferred embodiment of the invention, FIG. 1A being a perspective view, FIG. 1B being a sectional view, and FIG. 1C being an enlarged sectional view.
Figure 1B:
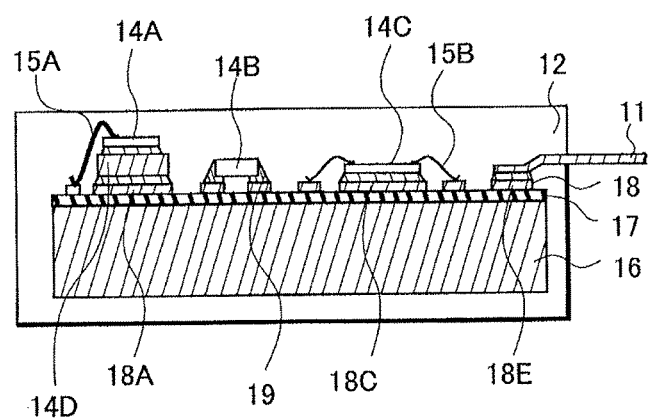
Figure 1C:
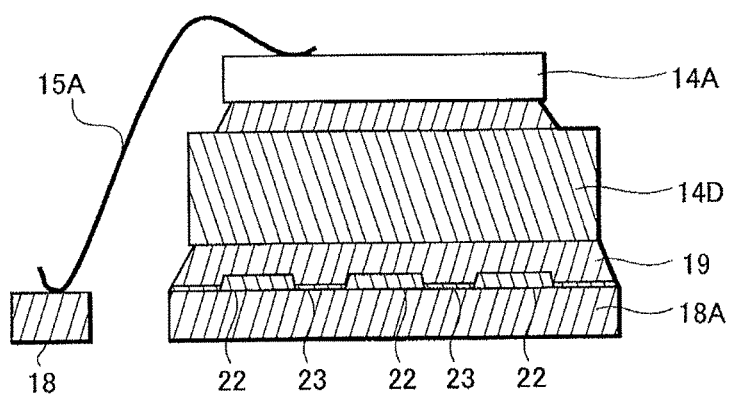

In this embodiment, with reference to FIG. 1, a description is given of the configuration of a hybrid integrated circuit device 10 as an example of a circuit device of a preferred embodiment of the invention. FIG. 1A is a perspective view of the hybrid integrated circuit device 10, and FIG. 1B is its sectional view. FIG. 1C is a sectional view showing how a transistor 14A (a circuit element) is attached.

Referring to FIGS. 1A and 1B, in the hybrid integrated circuit device 10, a conductive pattern 18 is formed on a surface of the substrate 16, and circuit elements such as transistors are attached to the conductive pattern 18 with solder 19. Then, at least the top surface of the substrate 16 is sealed by sealing resin 12.

The substrate 16 is a metallic substrate made of a metal such as aluminum or copper or a substrate made of a resin material such as epoxy resin. If an aluminum substrate is employed as the substrate 16, main surfaces of the substrate 16 are both coated with an anode oxide film formed through an alumite treatment. A specific size of the substrate 16 is about, for example, length×width×thickness=60 mm×40 mm×1.5 mm.

An insulating layer 17 is formed, covering an entire upper surface of the substrate 16. The insulating layer 17 is made for example of epoxy resin which is highly filled with a filler of Al2O3 or the like. Thereby, heat produced by the embedded circuit elements can be released well to the outside through the substrate 16. A specific thickness of the insulating layer 17 is about, for example, 50 µm.

The conductive pattern 18 is formed by a metal film made mainly of copper, and is formed on a surface of the insulating layer 17 so that a predetermined electric circuit is implemented. By the conductive pattern 18, pads 18A, pads 18C, and pads 18E are formed. Each pad will be described in detail later with reference to FIG. 2.

Circuit elements such as the power transistor 14A, a chip component 14B, and a small-signal transistor 14C are attached to predetermined portions of the conductive pattern 18 with the solder 19. The power transistor 14A is improved in its heat release performance by being attached to the pad 18A with a heat sink 14D interposed therebetween. The chip component 14B is attached at its both electrodes to the conductive pattern 18 with the solder 19. The small-signal transistor 14C is attached at its rear surface to the pad 18C via the solder 19. For example, the power transistor 14A is a transistor through which a current of 1 A or larger flows, and the small-signal transistor 14C is a transistor through which a current of smaller than 1 A flows. An electrode at a surface of the power transistor 14A is connected to the conductive pattern 18 with a thick wire 15A which is a metal wire having a thickness of 100 µm or more. An electrode formed on a surface of the small-signal transistor 14C is connected to the conductive pattern 18 with thin wires 15B having a thickness of about 80 µm or less.

Circuit elements that can be mounted on the substrate 16 are semiconductor elements such as transistors, LSI chips, and diodes. In addition, chip components such as chip resistors, chip capacitors, inductors, thermistors, antennas, and oscillators can be employed as the circuit elements. Moreover, a resin-sealed circuit device can be embedded in the hybrid integrated circuit device 10 as a circuit element. In this embodiment, the transistor 14A having the heat sink 14D attached to its lower surface can be regarded as one circuit element.

A lead 11 is attached to each pad 18E provided at a peripheral portion of the substrate 16 and plays a role in receiving inputs from and sending outputs to the outside. Although a number of leads 11 are attached to a single side here, the leads 11 can be led from four sides of the substrate 16 or from two opposite sides thereof.

A sealing resin 12 is formed through transfer molding using a thermosetting resin. Referring to FIG. 1B, the sealing resin 12 covers the conductive pattern 18 and the circuit elements formed on the surface of the substrate 16. The side surface and the rear surface of the substrate 16 are also covered by the sealing resin 12, whereby the moisture resistance of the whole device can be improved. The rear surface of the substrate 16 does not have to be covered by the sealing resin 12 in order to improve the heat release performance of the substrate 16. Further, the sealing may be done not with the sealing resin 12, but with a case member.

Referring to FIG. 1C, a description is given of how the heat sink 14D is bonded to the pad 18A. Specifically, the heat sink 14D is being attached, with the solder 19, to the upper surface of the pad 18A made mainly of copper, and an electrode of the transistor 14A at its lower side is being attached to an upper surface of the heat sink 14D.

With the thick wire 15A, the electrode on the upper surface of the power transistor 14A is connected to a pad-shaped portion of the conductive pattern 18 located near the pad 18A. As described above, placing the heat sink 14D between the transistor 14A and the pad 18A increases a heat transfer area, so that heat released by the transistor 14A is transferred to the substrate 16 well.

When a MOSFET is used as the transistor 14A, a drain electrode provided at a lower surface of the transistor 14A is connected to the pad 18A via the heat sink 14D, and a source electrode provide at the upper surface of the transistor 14A is connected, with the thin line 15A, to a different portion of the conductive pattern 18 located near the pad 18A. Then, a gate electrode placed at the upper surface of the transistor 15A is connected, with the thick wire 15A or a thin wire, to a different portion of the conductive pattern 18 placed around the pad 18A.

An intermetallic compound is formed at a border portion between the upper surface of the pad 18A and the solder 19, the intermetallic compound being formed by the material of the solder pad 18A and the material of the solder 19. When, for example, the pad 18A is made of copper and the solder 19 is made mainly of tin, the Cu/Sn alloy layer described above is formed. Particularly when lead-free solder made mainly of tin is used as the solder 19, a thick Cu/Sn alloy layer is likely to be formed.

In this embodiment, the heat sink to the upper surface of which the transistor 14A is attached is used as an element attached to the upper surface of the pad 18A. Instead, a different element may be attached to the pad 18A. For example, the transistor 14A may be directly attached to the upper surface of the pad 18A.

As an advantage of this embodiment, the above-described alloy layer is partly reduced in thickness to improve the reliability of connection between the solder 19 and the pad 18A. Specifically, an alloy layer made of a Cu/Sn alloy is brittle. Due to this property, when the alloy layer is formed thickly, while the device is in use, the solder 19 and the pad 18A might detach from each other at a portion where the alloy layer is formed. To prevent this, the alloy layer formed is partly reduced in thickness. Thereby, although the strength is low at a thick alloy layer 22, the strength is secured at a thin alloy layer 23. Thus, cracking occurring while the device is in use is suppressed at this alloy layer portion.

The thick alloy layer 22 is formed into portions arranged in matrix at the upper surface of the pad 18A, and the thin alloy layer 23 is formed in grids extending between the portions of the thick alloy layer 22. The grid formation of the thin alloy layer 23 prevents detachment of the alloy layer 23 over the entire pad 18A.

The thin alloy layer 22 is placed at the four sides of the pad 18A, and this also suppresses detachment between the solder 19 and the pad 18A.

Such an alloy layer is obtained by forming solder at multiple separate portions, as will be described later. Referring to FIG. 5B, portions on the upper surface of the pad 18A where the solder 19 is formed are regions where the thick alloy layer 22 above described is formed, and regions on the upper surface of the pad 18A where the solder 19 is not formed are regions where the thin alloy layer 23 above described is formed.

Second Embodiment

In this embodiment, with reference to FIGS. 2 to 7, a method for manufacturing a hybrid integrated circuit device 10 described above is described.

First Step: Refer to FIG. 2

Figure 2A:
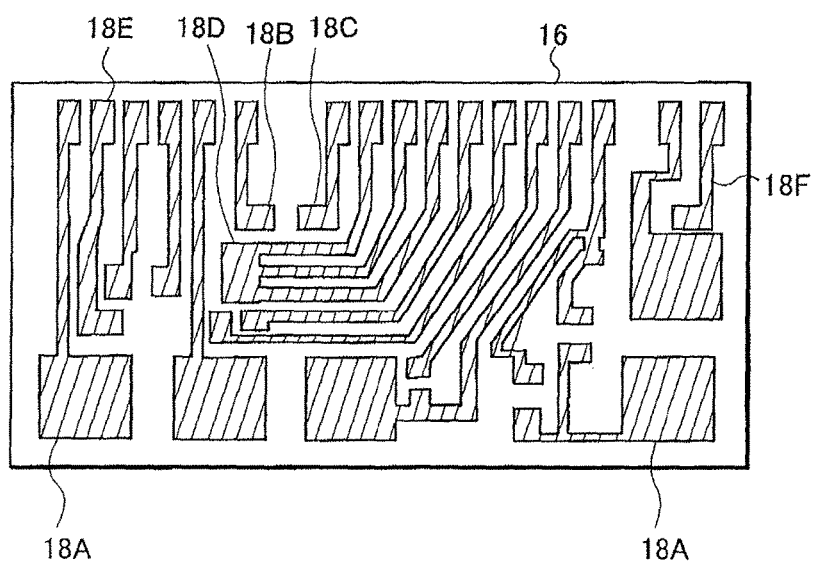
FIG. 2 is diagrams showing a method for manufacturing the circuit device of the preferred embodiment of the invention, FIG. 2A being a plan view, FIG. 2B being a sectional view.

In this step, a conductive pattern 18 is formed on a surface of a substrate 16. FIG. 2A is a plan view of the substrate 16 in this step, and FIG. 2B is a sectional view thereof.

Figure 2B:
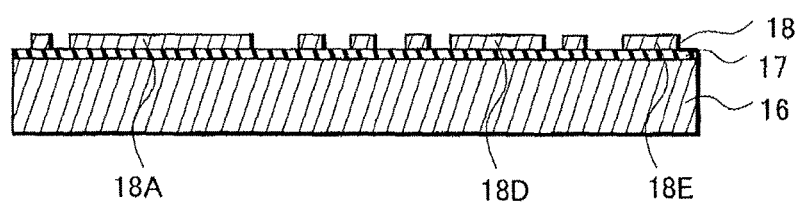

Referring to FIGS. 2A and 2B, the conductive pattern 18 of a predetermined pattern shape is formed by patterning a conductive foil adhered to the surface of the substrate 16. Here, pads 18A to 18E are formed by the conductive pattern 18. Each pad 18A is a pad to which a heat sink is to be attached in a later step, and is formed in a relatively large size. For example, the pad 18A is formed into a quadrangular shape of 9 mm×9 mm or larger. The pads 18B and 18C are pads to which both electrodes of a chip element, such as a chip capacitor, are to be attached with solder in a later step. The pad 18D is a pad to which a small-signal transistor or an LSI is to be attached, and is formed in a small size compared to the pad 18A. The pad 18D is a quadrangle having a size of about, for example, 2 mm×2 mm. There are multiple pads 18E formed along an upper side (as in the drawing) of the substrate 16 at substantially equal intervals. Leads 11 are attached to the respective pads 18E in a later step. Moreover, a wiring pattern 18F is formed, extending to connect the pads to each other.

The conductive pattern 18 described above is formed with a metal the main material of which is copper. The upper surfaces of the pads 18A and so on are not coated with a plating film or the like, and the metal material forming the conductive pattern 18 is exposed there. Further, under a general working atmosphere, the surface of the pad 18A may be coated with a thin oxide film, but this oxide film is removed by a flux contained in solder paste to be applied later.

Second Step: Refer to FIG. 3

In this step, solder paste 21A is applied to the upper surfaces of the pads 18A to 18D.

Figure 3A:
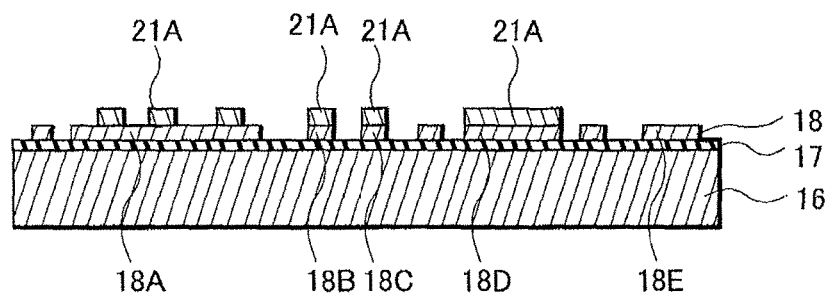
FIG. 3 is diagrams showing the method for manufacturing the circuit device of the preferred embodiment of the invention, FIG. 3A being a sectional view, FIG. 3B being a plan view, and FIG. 3C being an enlarged plan view.

Specifically, referring to FIG. 3A, the solder paste 21A is applied to the upper surfaces of the pads 18A to 18D through screen printing. In this step, the solder paste 21A is printed and applied to the upper surfaces of the pads 18B to 18D to which small-signal elements are to be mounted in a later step and to the upper surface of each large pad 18A.

Figure 3B:
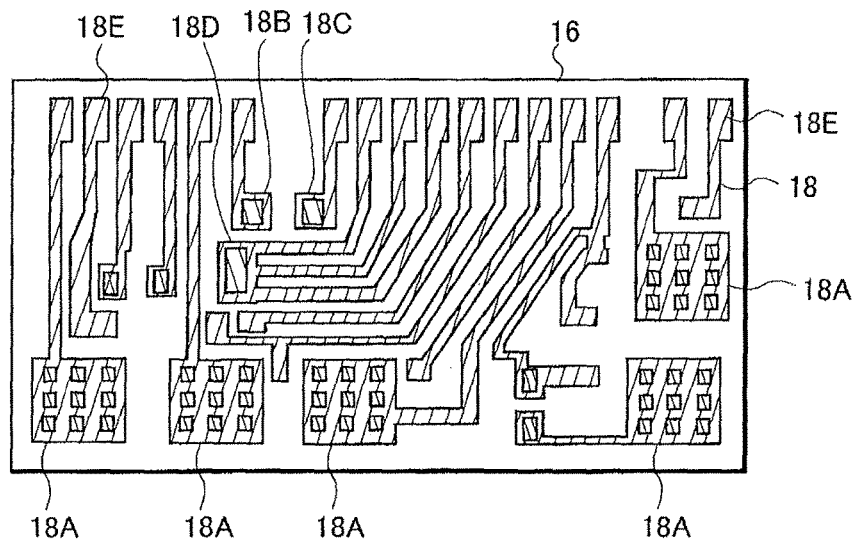

Referring to FIGS. 3A and 3B, the pads 18B and 18C are elements on which a chip element, such as a resistor, is to be mounted, and the solder paste 21A is applied, as a single portion, to an almost entire area of the upper surface of each of the pads 18B and 18C. The pad 18D is a pad to which an LSI for control is to be attached, and the solder paste 21A is applied to an almost entire area of its upper surface as a single portion.

The pad 18E located at the right end in FIG. 3A is a pad to which a lead (an external output terminal) is to be attached in a later step, and solder is therefore not bonded there in this step.

Figure 3C:
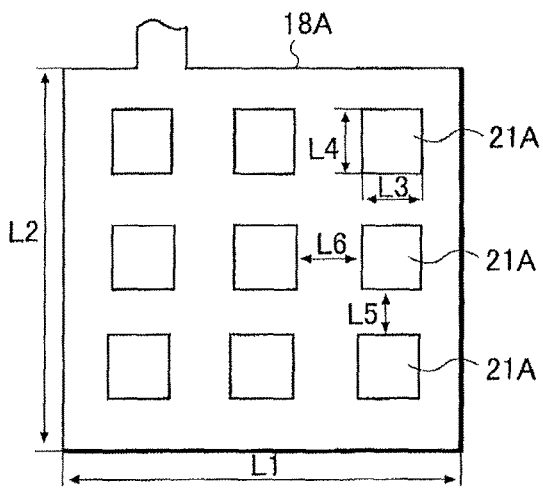

On the other hand, referring to FIG. 3C, the solder paste 21A is applied to the upper surface of the pad 18A not with an even thickness over the entire surface, but discretely. Specifically, on the upper surface of the pad 18A, a total of nine portions of the solder paste 21A are arranged away from each other in a matrix of three rows and three columns. Although nine portions of the solder paste 21A are arranged on the surface of the pad 18A here, the number of the portions may be about two, four, or six.

First, the pad 18A on which the portions of the solder paste 21A are discretely arranged has a quadrangular shape in a plan view, L1 thereof being between 4.5 mm and 13.0 mm, inclusive, L2 thereof being about the same.

Each portion of the solder paste 21A has a quadrangular shape in a plan view, L3 thereof being between 2.4 mm and 3.4 mm, inclusive, L4 thereof being about the same. The solder paste 21A may be square or rectangular. When each side of the solder paste 21A is too long, the amount of the solder paste 21A increases to increase the surface tension, making it more likely to cause the dewetting described earlier. Conversely, when each side of the solder paste 21A is too short, the amount of the solder paste 21A becomes insufficient, so that the strength of connection between the pad 18A and an element to be attached to the upper surface of the pad 18A becomes insufficient.

The portions of the solder paste 21A are spaced away from each other so that they can maintain the discretized state even after they are melted. Distance L5 by which the portions of the solder paste 21A are away from each other in a vertical direction in the drawing is for example between 0.9 mm and 1.7 mm, inclusive. Length L6 by which the portions of the solder paste 21A are away from each other in a horizontal direction in the drawing is the same. If the distance by which the portions of the solder paste 21A are away from each other is too short, they are integrated when melted, and consequently, the surface tension of the liquid solder increases to cause the dewetting. If the distance by which the portions of the solder paste 21A are away from each other is too long, the amount of the solder paste 21A might be insufficient.

This step is performed by screen printing or supply by use of a syringe. When screen printing is used, a screen having openings at regions to be coated with the solder paste 21A is placed on the upper surface of the substrate 16, and solder paste is supplied to the openings of the screen by use of a squeegee. After that, the screen is removed from the substrate 16 to apply the solder paste 21A to the predetermined positions.

The solder paste 21A used in this step is a mixture of a flux and a solder powder. The solder powder mixed for the solder paste 21A can be either lead-containing solder or lead-free solder. A specific conceivable composition of the solder powder includes, for example, Sn63/Pb37, Sn/Ag3.5, Sn/Ag3.0/Cu0.5, Sn/Ag2.9/Cu0.5, Sn/Ag3.0/Cu0.5, Sn/Bi58, Sn/Cu0.7, Sn/Zn9, Sn/Zn8/Bi3, and the like. These numbers indicate the weight percent of the total solder. Considering the fact that lead puts a heavy environmental load, lead-free solder is preferably used.

Among the above-described compositions of the lead-free solder, solder having a composition of Sn/Ag3.0/Cu0.5 is optimal in view of its favorable melting point and the like. The weight percent of Ag contained in the solder may be between 2.0% and 4.0%, inclusive, and the weight percent of Cu may be between 0.5% and 0.8%, inclusive.

Since lead-free solder is often made mainly of Sn (tin), an intermetallic compound layer containing copper and tin and providing poor wettability is generated at the border between the pad 18A and the solder 19.

A rosin-based flux can be used as the flux contained in the solder paste 21A. In this embodiment, after completion of a reflow step, residual flux is removed by cleaning.

Third Step: Refer to FIGS. 4 and 5

Next, elements other than the power transistors (e.g., the small-signal transistor and chip components) are electrically connected, and the solder 19 is formed discretely on the upper surface of each pad 18A.

Figure 4A:
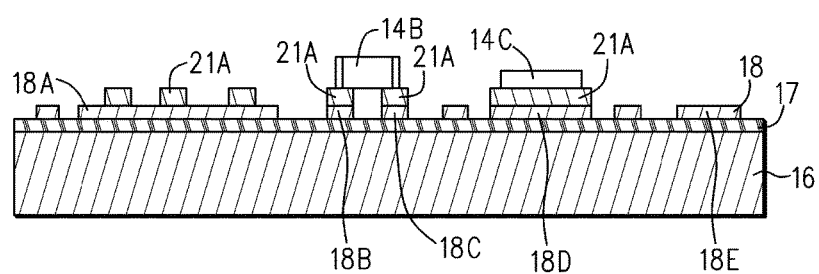
FIG. 4 is diagrams showing the method for manufacturing the circuit device of the preferred embodiment of the invention, FIG. 4A being a sectional view, FIG. 4B being a sectional view, FIG. 4C being a sectional view, and FIG. 4D being an expanded view o f a portion of FIG. 4C.

First, referring to FIG. 4A, elements to be connected in this step are placed on the corresponding solder paste 21A. Specifically, a chip component 14B is placed on and temporarily fixed to the solder paste 21A applied to the pads 18B and 18C. Similarly, a transistor 14C is placed on the upper surface of the solder paste 21A applied to the upper surface of the pad 18D.

Figure 4B:
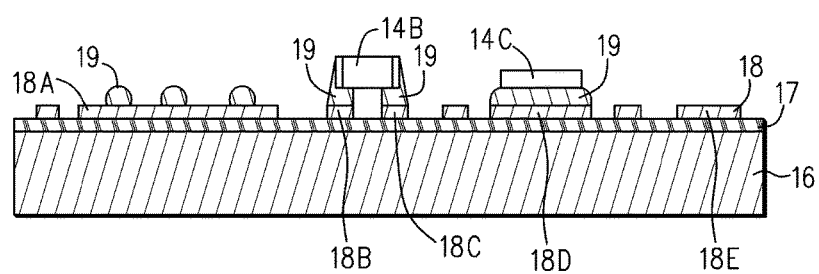

Next, referring to FIG. 4B, the solder paste 21A described above is melted by being superheated through a reflow step, and the solder 19 is formed consequently. Thereby, electrodes of the chip component 14B are attached to the pads 18B and 18C, respectively, with the solder 19. A rear surface of the transistor 14C is also attached to the upper surface of the pad 18D with the solder 19. By this reflow step, the portions of the solder paste applied to the upper surface of the pad 18A are also melted and become the solder 19 (first solder).

Figure 4D:
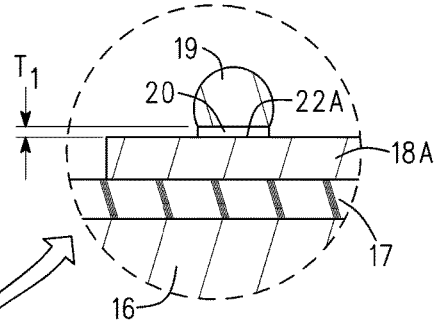
Figure 4C:
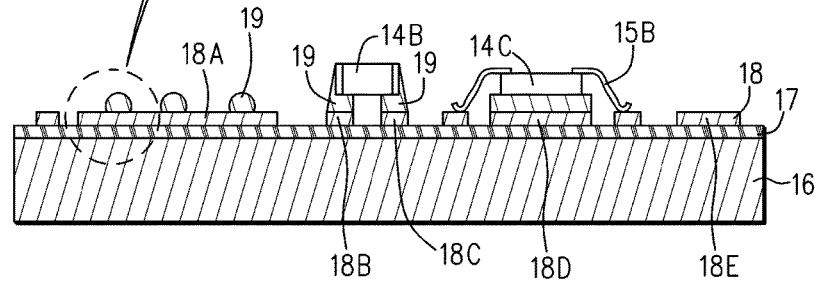

Referring to FIG. 4C, next, electrodes located on the upper surface of the transistor 14C are connected, via the thin wires 15B, to pads formed by the conductive pattern and located around the pad 18D. The thin wire 15B is a metallic wire made of gold, copper, or aluminum and having a thickness of 80 µm or smaller. FIG. 4D is an expanded view of a portion of FIG. 4C to further illustrate a layer 20 of intermetallic compound formed at the border portion between the upper surface of pad 18A and solder 19. Intermetallic compound layer 20 has a thickness $T_1$. Layer 20 may be referred to as an alloy layer.

Figure 5A:
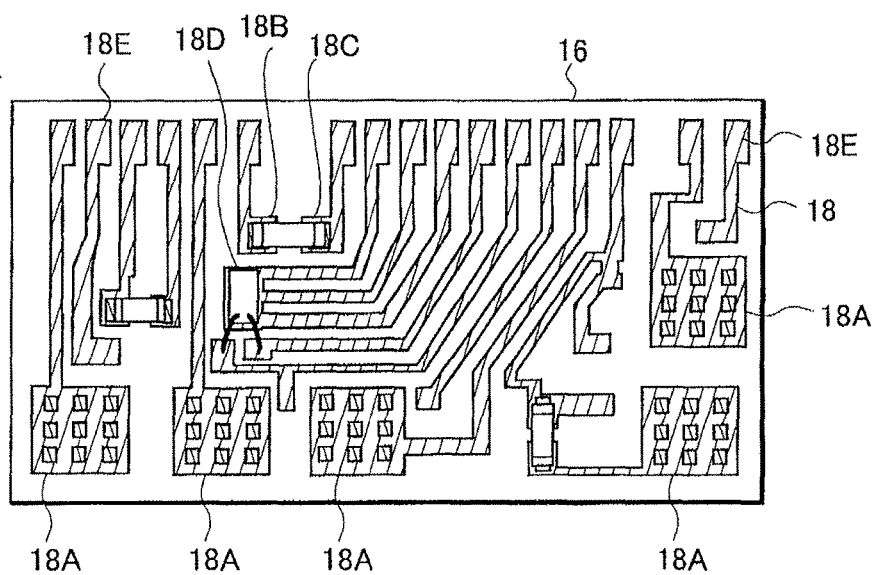
FIG. 5 is diagrams showing the method for manufacturing the circuit device of the preferred embodiment of the invention, FIG. 5A being a plan view, FIG. 5B being an enlarged plan view.
Figure 5B:
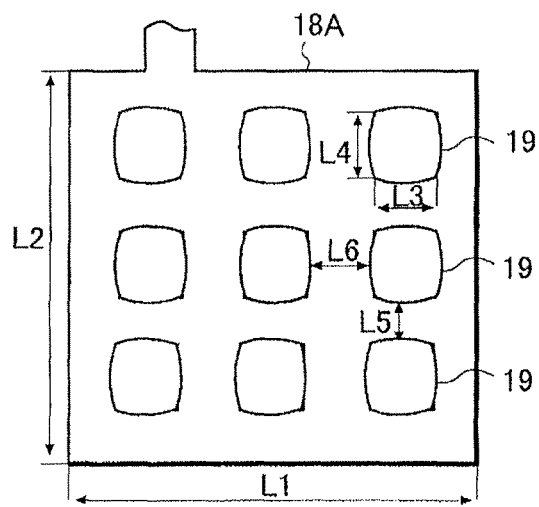

FIG. 5 shows the state of the substrate 16 after completion of this step. FIG. 5A is a plan view showing the upper surface of the substrate 16 after the completion of this step, and FIG. 5B is an enlarged plan view showing the pad 18A.

Referring to FIGS. 5A and 5B, on the upper surface of the pad 18A, a total of nine portions of solder 19 are arranged away from each other in three rows and three columns. The planar size of each portion of the solder 19 is slightly larger than that described with reference to FIG. 3C, and has a quadrangular shape which is somewhat swelling. This is because the solder paste has spread outward by being melted. Distances L5 and L6 by which the portions of the solder 19 are away from each other are slightly shorter than those shown in FIG. 3C. However, even after this step, the portions of the solder 19 maintain to be separated from each other.

In this embodiment, the solder dewetting is prevented by providing small portions of solder 19 discretely on the upper surface of the pad 18A.

To be more specific, as described above, the pad 18A onto which a heat sink is to be mounted in a later step is large, each side being, for example, 9 mm or more. For this reason, when solder paste is applied to the entire upper surface of the pad 18A and melted into a large amount of liquid solder, a high surface tension acts on the liquid solder. This surface tension causes the solder 19 to dewet. At this dewetting portion having no solder 19, the Cu/Sn alloy generated by the pad 18A and the solder 19 is exposed. At this Cu/Sn alloy exposing surface, extremely poor wettability is exhibited, and consequently solder is not bonded to this region in a later step, so that a void is formed.

In this embodiment, the small portions of the solder 19 are formed discretely on the upper surface of the pad 18A to make the surface tension small, and therefore the solder 19 bonded to the upper surface of the pad 18A is prevented from dewetting. Consequently, the Cu/Sn layer is not exposed on the upper surface of the pad 18A at a region where the solder 19 is not formed. In other words, in this region, a metal material of the pad 18A, such as copper, is exposed. This prevents lowering of the solder wettability at this region.

Fourth Step: Refer to FIG. 6

Referring to FIG. 6, next, a heat sink 14D to which the transistor 14D is attached is attached to the upper surface of each pad 18A.

Referring to FIG. 6A, first, solder paste 31 is additionally supplied to the upper surface of the pad 18A. Since circuit elements such as the chip component 14B have already been placed on the upper surface of the substrate 16, it is difficult to perform screen printing. For this reason, in this step, the solder paste 31 is supplied to the upper surface of the pad 18A by use of a syringe 30. In this step, the solder paste 31 is supplied into balls to fill the gaps between the portions of the solder 19 already formed on the upper surface of the pad 18A. The composition of the solder paste 31 used in this step may be the same as that of the solder paste 21A shown in FIG. 3A.

In this step, the solder paste 31 is in contact with the upper surface of the pad 18A at the region where no solder 19 is formed. Further, the surfaces of the portions of the solder 19 are covered with the solder paste 31.

Referring to FIG. 6B, next, the heat sink 14D to which the power transistor 14A is attached is placed on the upper surface of the solder 19. Although the transistor 14A is attached to the upper surface of the heat sink 14D with solder in advance here, the transistor 14A may be attached to the heat sink 14D after the heat sink 14D is attached to the pad 18A.

By performing a reflow step in this state, the solder formed on the upper surface of the pad 18A and the solder paste 31 melt. As a result of the melting, the solder 19 formed previously and the solder paste 31 mix together, so that the heat sink 14D is attached to the upper surface of the pad 18A with solder 19 (second solder) shown in FIG. 6C additionally formed. Moreover, the solder 19 attaching the chip component 14B and the transistor 14C is also melted in this step and is then solidified.

Copper, which is the material of the pad 19A, is exposed at the region of the upper surface of the pad 18A where the solder 19 is not bonded. In other words, the Cu/Sn alloy layer having poor solder wettability is not exposed in this region. Hence, the solder formed in this embodiment adheres to this region well, and thus void formation is suppressed.

Referring to FIG. 6C, after completion of the attachment of the heat sink 14D with the solder 19, an electrode located at the upper surface of the transistor 14A is connected to the conductive pattern 18 via a thick wire 15A.

In this step, the above-described alloy layer is generated between the pad 18A and the solder 19 as a result of melting the solder paste to form the solder 19. Specifically, alloy layers 22 and 23 having different thicknesses are generated at the border portion between the pad 18A and the solder 19. FIG. 6D is an expanded view of a portion of FIG. 6C to further illustrate that alloy layer 22 has a thickness $T_3$ and alloy layer 23 has a thickness $T_2$, where thickness $T_2$ is less than thickness $T_3$.

The alloy layer 22 is located at spots where the above-described portions of solder 19 are discretely arranged, and is relatively thick since melting of solder is performed twice. In other words, the alloy layer 22 includes the alloy layer generated in the step shown in FIG. 4 and the alloy layer generated in this step.

The alloy layer 23, on the other hand, is generated only in this step (i.e., as a result of only one melting), and its thickness is, for example, about half or less than half of that of the alloy layer 22. Referring to FIG. 6A, such an alloy layer having an uneven thickness is provided by forming portions of the solder 19 first, and then later forming the solder paste 31 throughout the surface.

In this embodiment, as described above, solder is provided discretely first, and then the solder paste 31 is supplied again thereafter to form the solder 19. Thereby, two effects are obtained: securement of a sufficient amount of solder for mounting the heat sink 14D and prevention of dewetting of the solder.

Fifth Step: Refer to FIG. 7

In this step, the lead 11s are attached, and the sealing resin 12 is formed.

Figure 7A:
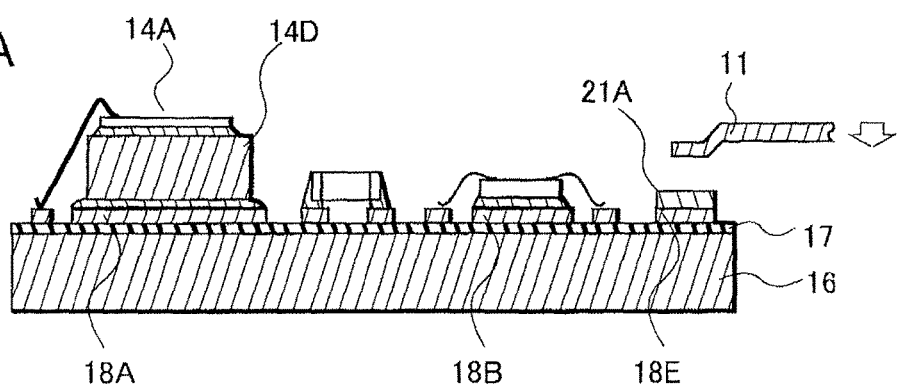
FIG. 7 is diagrams showing the method for manufacturing the circuit device of the preferred embodiment of the invention, FIG. 7A being a sectional view, FIG. 7B being a sectional view.

Referring to FIG. 7A, first, the solder paste 21A is applied to the upper portion of each pad 18E, and the lead 11 is placed thereon. Then, the solder paste 21A is melted to attach the lead 11.

Figure 7B:
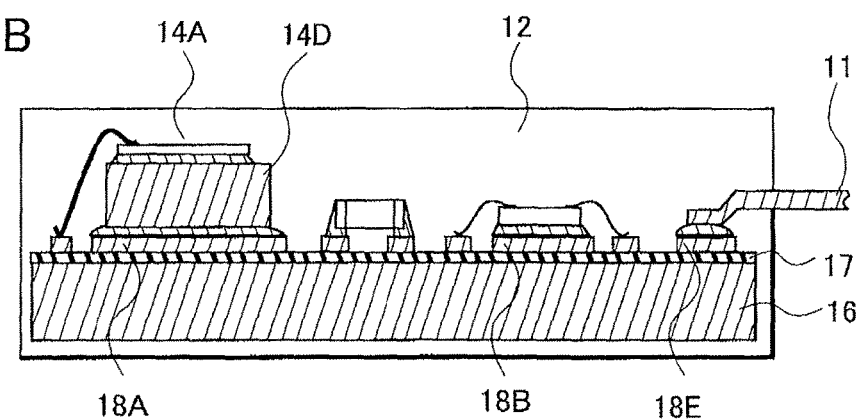
Figure 8A:
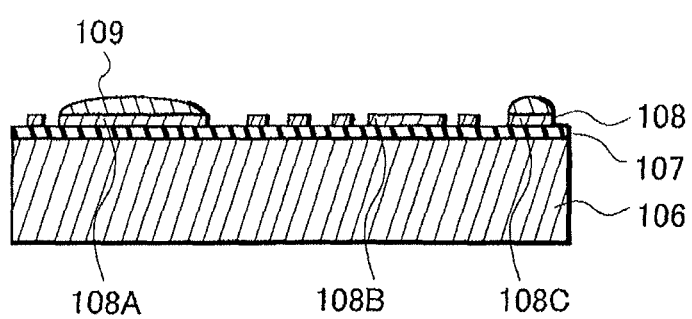
FIG. 8 is diagrams showing a conventional method for manufacturing a circuit device, FIGS. 8A to 8C each being a sectional view.
Figure 8B:
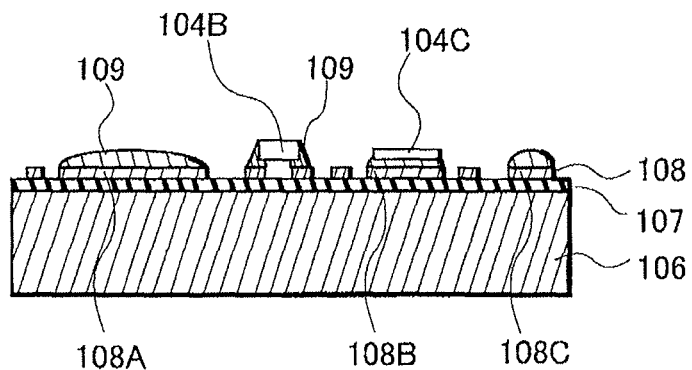
Figure 8C:
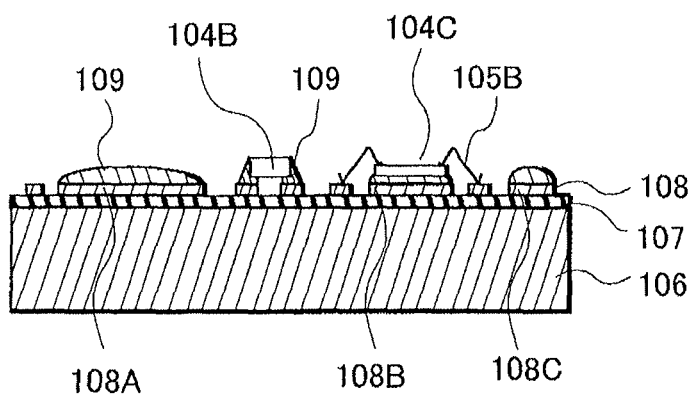
Figure 9A:
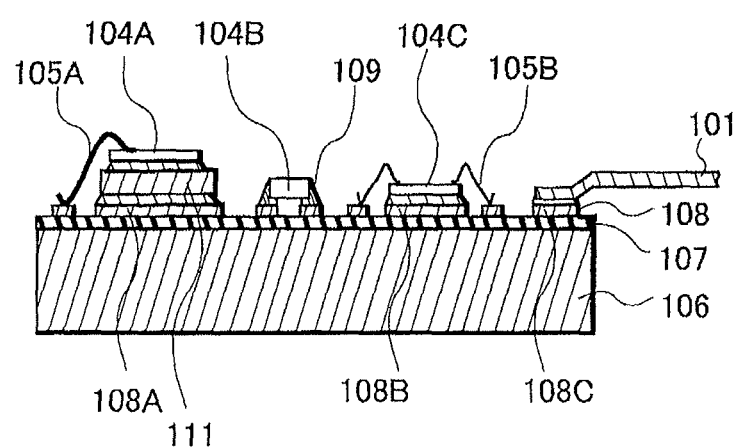
FIG. 9 is diagrams showing the conventional method for manufacturing a circuit device, FIG. 9A being a sectional view, FIG. 9B being a sectional view.
Figure 9B:
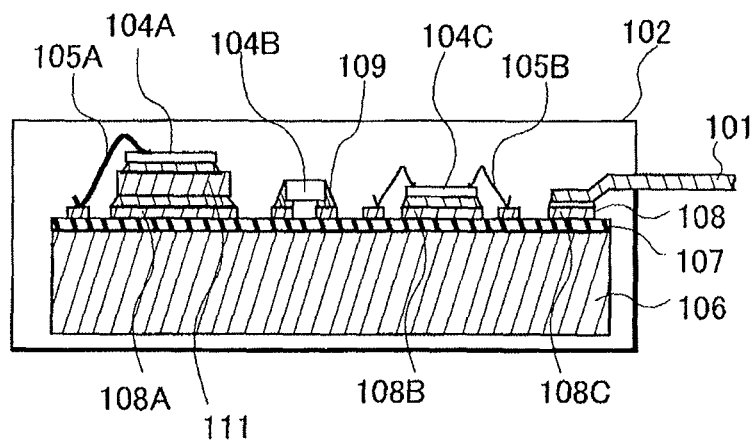
Figure 10A:
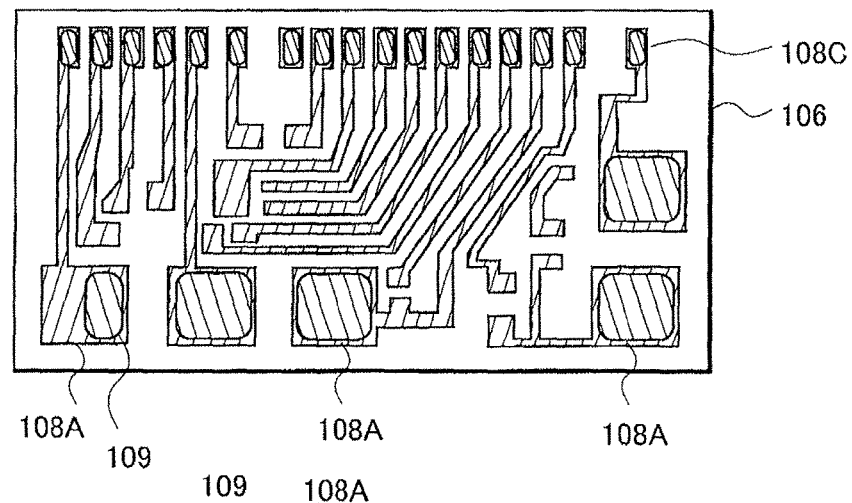
FIG. 10 is diagrams showing the conventional method for manufacturing a circuit device, FIG. 10A being a plan view, FIG. 10B being a sectional view, FIG. 10C being an enlarged sectional view.
Figure 10B:
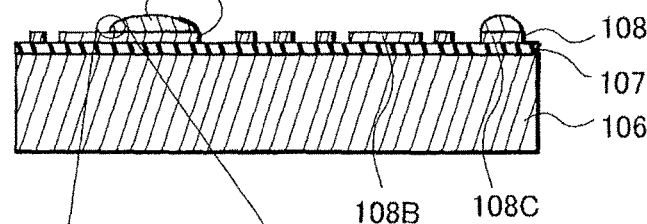
Figure 10C:
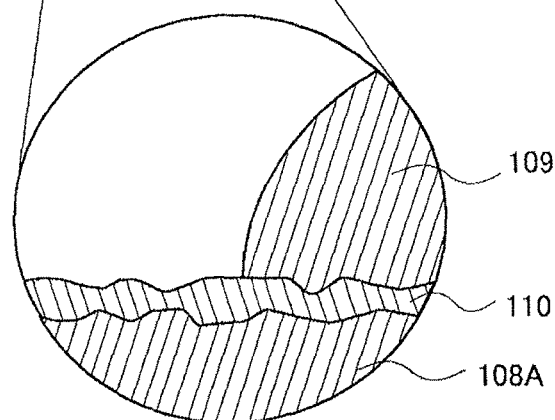

Referring to FIG. 7B, next, the sealing resin 12 is formed, covering the circuit elements attached to the surface of the substrate 16. In this embodiment, the sealing resin 12 is formed to cover the side surface and the rear surface of the substrate 16, as well. The sealing resin 12 may be formed, exposing the rear surface of the substrate 16 to the outside. Moreover, the surface of the substrate 16 may be sealed by using a case member.

With the steps described above, the hybrid integrated circuit device 10 shown in FIG. 1 is formed.

The invention claimed is:

1. A method of manufacturing a circuit device, comprising the steps of:
providing a substrate having a pad formed thereon, the pad having an upper surface;
forming a plurality of portions of a first solder on the upper surface of the pad, the portions of the plurality of portions of the first solder being spaced away from each other so that they can maintain a discretized state even after they are melted, and wherein the portions of first solder are arranged as an array of elements laterally positioned in rows and columns on the upper surface of the pad; and
heating the plurality of portions of the first solder to melt the portions of the plurality of portions of the first solder, wherein each portion of the plurality of portions of the first solder maintains a discretized state after melting, and wherein each portion of the plurality of portions of the first solder comprises an alloy portion having a first thickness formed vertically between a corresponding portion of the pad and a solder portion;
applying a second solder to the upper surface of the pad and the plurality of solder portions;
mounting a component to the second solder; and
heating the second solder and the discretized portions of the plurality of portions of the first solder to form an alloy layer, wherein heating the second solder increases the thickness of the alloy portions between the corresponding portions of the pad and the solder portions to a second thickness and creates another alloy portion laterally between the plurality of solder portions, the another alloy portion having a third thickness, the third thickness less than the second thickness.

2. The method for manufacturing a circuit device according to claim 1, wherein the portions of first solder are formed directly on the upper surface of the pad, and the solder paste is applied to surfaces of the portions of first solder and the upper surface of the pad.

3. The method for manufacturing a circuit device according to claim 1, wherein in a plan view, the portions of first solder are each formed into a quadrangular shape, each side of which is 3 mm long or shorter.

4. The method for manufacturing a circuit device according to claim 1, wherein in the step of forming the portions of first solder, a chip element or a small-signal transistor is attached to an upper surface of the circuit substrate with solder.

5. The method for manufacturing a circuit device according to claim 1, wherein the circuit element is a heat sink to an upper surface of which a transistor is attached.

6. The method for manufacturing a circuit device according to claim 1, wherein forming the solder paste to the upper surface of the pad from which the plurality of portions of the first solder are absent includes supplying the solder paste with a syringe.

7. The method for manufacturing a circuit device according to claim 1, wherein forming the solder paste to the upper surface of the pad from which the plurality of portions of the first solder are absent includes filling the gaps between the plurality of portions of first solder on an upper surface of a pad.

8. The method for manufacturing a circuit device according to claim 1, wherein forming the solder paste to the upper surface of the pad from which the plurality of portions of the first solder are absent includes applying the solder paste to cover the portions of the first solder and the upper surface of the pad.

9. The method for manufacturing a circuit device according to claim 1, further including placing a circuit element on an upper surface of the solder paste before melting the solder paste.

10. The method for manufacturing a circuit device according to claim 1, further including placing a heat sink on an upper surface of the solder paste before melting the solder paste.

11. A method of manufacturing a circuit device, comprising:
providing a substrate having a pad formed thereon;
forming at least a first solder structure and a second solder structure on the pad, wherein the first solder structure is separate from the second solder structure;
heating at least the first solder structure and the second solder structure to melt at least the first solder structure and the second solder structure, wherein the melted first solder structure comprises a modified first solder structure and the melted second solder structure comprises a modified second solder structure, the modified first solder structure comprising a first alloy portion having a first thickness in contact with a first portion of the pad and a first solder portion in contact with the first alloy portion and the modified second solder structure comprising a second alloy portion having the first thickness in contact with a second portion of the pad and a second solder portion in contact with the second alloy portion, the modified first solder structure and the modified second solder structure remaining separate solder structures after melting;
forming a plurality of solder portions on the pad, the plurality solder portions laterally spaced apart from each other to expose portions of the pad;
forming a solder paste on the plurality of modified first solder portions structure, the modified second solder structure and the exposed portions of the pad; and
mounting a component of the solder paste; and
heating the solder paste to melt the solder paste, wherein the melted solder paste mixes with the plurality of modified solder structures portions to form a unitary solder structure, and wherein in response to heating the solder paste a third alloy portion having a second thickness is formed laterally on the pad and a thickness of the first alloy portion of the modified first solder structure and the second alloy portion of the second modified solder structure increases from the first thickness to a third thickness, the second thickness less than the third thickness.

12. The method of claim 11, wherein heating the solder paste includes melting the solder paste.

13. The method of claim 11, further including placing wherein the component is a circuit element in the solder paste before heating the solder paste.

14. The method of claim 13, wherein the circuit element is a heat sink.

* * * * *